United States Patent [19]

Garth et al.

[11] Patent Number: 4,982,091

[45] Date of Patent: Jan. 1, 1991

[54] ELECTRON BEAM APPARATUS AND METHOD FOR DETECTING SECONDARY ELECTRONS

[75] Inventors: Simon C. J. Garth; John N. Sackett; Denis F. Spicer, all of Bedford, England

[73] Assignee: Texas Instruments Incorporated, Dallas, Tex.

[21] Appl. No.: 130,716

[22] Filed: Dec. 9, 1987

[30] Foreign Application Priority Data

Dec. 12, 1986 [GB] United Kingdom ............... 8629753

[51] Int. Cl.$^5$ ..................... H01J 37/26; H01J 49/44
[52] U.S. Cl. ..................................... 250/310; 250/305
[58] Field of Search .................. 250/305, 310, 396 ML

[56] References Cited

U.S. PATENT DOCUMENTS

| | | | |
|---|---|---|---|
| 4,464,571 | 8/1984 | Plies | 250/305 |
| 4,525,629 | 6/1985 | Morita et al. | 250/305 |
| 4,540,885 | 9/1985 | Plies et al. | 250/305 |
| 4,551,625 | 11/1985 | Lishke | 250/310 |
| 4,658,137 | 4/1987 | Garth et al. | 250/305 |
| 4,728,790 | 3/1988 | Plies | 250/305 |
| 4,769,543 | 9/1988 | Plies | 250/305 |

FOREIGN PATENT DOCUMENTS

| | | | |
|---|---|---|---|
| 0105440 | 4/1984 | European Pat. Off. | |
| 0138610 | 4/1985 | European Pat. Off. | |
| 6226754 | 2/1987 | Japan | 250/305 |
| 1566294 | 4/1980 | United Kingdom | |
| 1308839 | 3/1983 | United Kingdom | |
| 2187038 | 3/1987 | United Kingdom | |
| 2183898 | 6/1987 | United Kingdom | |

OTHER PUBLICATIONS

Kawamoto, "In-the-Lens-Analyzer", Proceedings of the Symposium on Electron Beam Testing, 9-10 Nov., 1984, pp. 69-72.
Scanning Electron Microscopy/1986/II, Aug., 1986, pp. 465-472.
Journal of Vacuum Science and Technology B., vol. 4, No. 1, Jan./Feb., 1986, "Magnetic Field Extraction of Secondary Electrons for Accurate Integrated Circuit Measurement", Garth et al., pp. 217-220.

*Primary Examiner*—Bruce C. Anderson
*Attorney, Agent, or Firm*—N. Rhys Merrett; James T. Comfort; Mel Sharp

[57] ABSTRACT

Electron beam apparatus for use in testing integrated circuits uses a magnetic electron objective lens having a first end adjacent the circuit under test and a second end remote from the circuit. The magnetic field of the lens increases steeply to a maximum near the first end and falls gradually towards the second end. Secondary electrons emitted from the circuit are accelerated strongly by an electrostatic field into the first end of the lens and are retarded abruptly to speeds of the same order as their emission speeds in the region of maximum magnetic field. Further gradual retardation of the electrons takes place so that the electrons approach the second end of the lens parallel to the axis of the lens at substantially their emission speeds. A filter grid located at the second end of the lens and a collector of electrons passing through the filter grid enable the emission speeds of the secondary electrons to be measured.

14 Claims, 4 Drawing Sheets

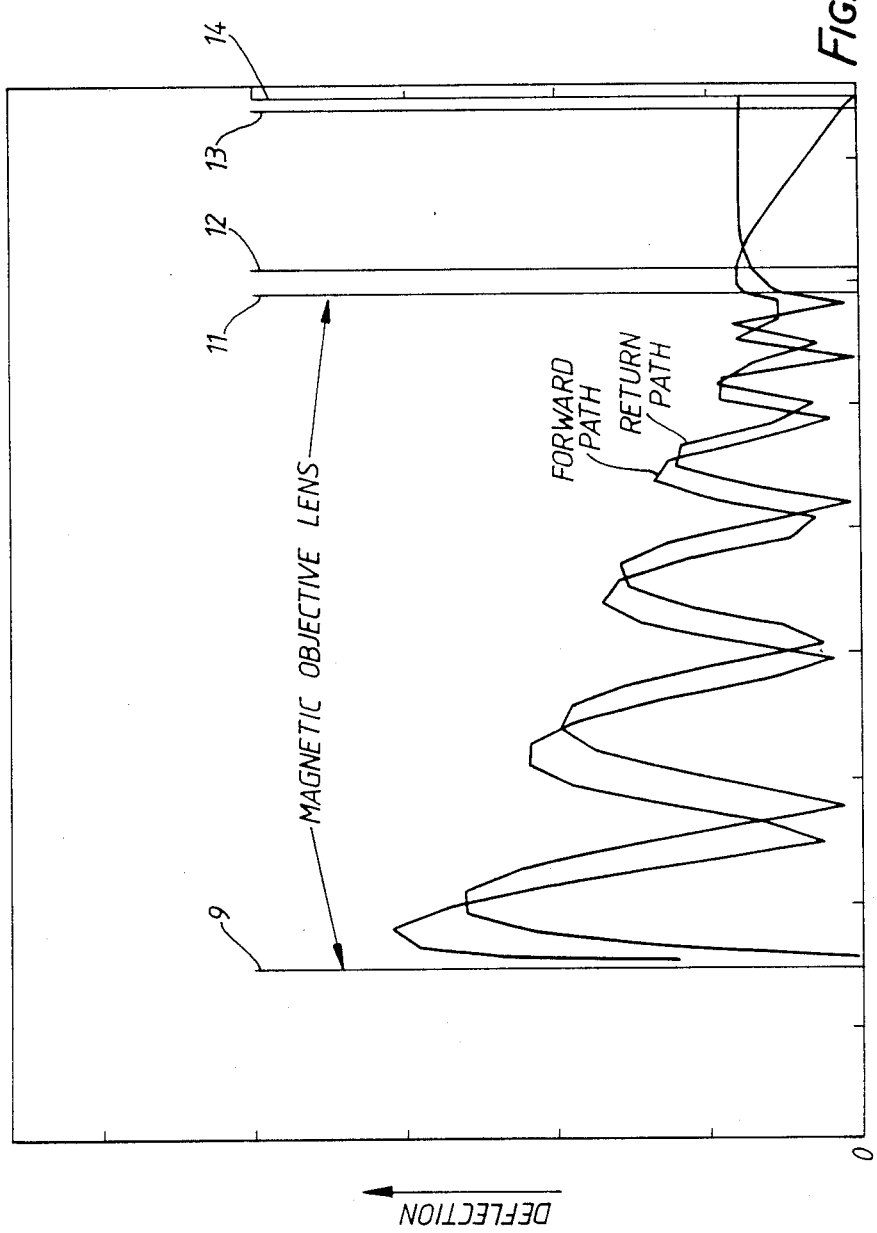

ELECTRON BEAM APPARATUS AND METHOD FOR DETECTING SECONDARY ELECTRONS

This invention relates to electron beam apparatus, especially to such apparatus as would be suitable for use in testing integrated circuits.

In a conventional scanning electron microscope an electron beam is scanned over an object and the resulting secondary electrons are collected as they are emitted and used to produce a scanned image. In some systems, the differences in the angles of emission of the secondary electrons are an important source of detail in the image produced and the electron detectors used with such microscopes are designed to retain the differences.

In the testing of integrated circuits, however, where an electron beam is used to obtain a measure of the potential on a part of the circuit, it is the energy or speed of the secondary electrons which is the important property to be measured, since this reflects the potential on the part of the circuit from which they were emitted. If all the secondary electrons were emitted normally from the surface, the measurement of their energies could be achieved by the use of a plane filter grid biassed to such a potential as to stop a proportion of the electrons. However, in practice the secondary electrons are emitted at various angles to the normal. In addition, the electrons may be deflected to large angles by intense electrostatic fields close to the surface of the integrated circuit. Measures have therefore to be taken to reduce the influence of the angles of the trajectories of the secondary electrons on the measurement of their energies.

An electron detector arrangement is described in U.S. Pat. No. 4,658,137 issued Apr. 14, 1987 and assigned to Texas Instruments Incorporated which places the integrated circuit under test at one pole of a magnetic lens and uses a progressively reducing axial magnetic field extending for some distance from the one pole to bring the helical trajectories of the secondaries to nearer parallel to the axis so that they approach a plane filter grid at angles close to the normal. Unfortunately, it has been found in practice that the steel connections of the integrated circuit where such are provided interfere with the imaging resolution as a result of the distortion which they produce in the intense magnetic field.

It is an object of the present invention to overcome the problems produced by having the integrated circuit under test in an intense magnetic field.

According to one aspect of the present invention there is provided electron beam apparatus having a vacuum envelope containing an electron gun for producing a stream of electrons, a first electron lens system for focussing the stream of electrons into an electron beam in an axial direction, electron beam deflecting means for deflecting the electron beam in a particular direction, a magnetic electron objective lens for focussing the electron beam to a fine point on a body, located beyond the objective lens, at a position on the body determined by the deflecting means, electrostatic means for extracting secondary electrons emitted by the body and directing them back into and through the magnetic electron objective lens, a filter grid placed so as to be approached by secondary electrons after passage through the objective lens and arranged to be biased to such a potential as to allow to pass only those secondary electrons having energies greater than a predetermined value and electron collecting means for receiving the secondary electrons passing through the filter grid, wherein the objective lens has an axial magnetic field which has a region of maximum field strength close to the end of the lens nearer the body, with a high gradient between the end of the lens nearer the body and the region of maximum field strength, and a low, more gradually decreasing gradient between the region of maximum field strength and the end of the lens further from the body, the extracting means is arranged to accelerate the secondary electrons to a high speed at which they pass through the high gradient part of the objective lens field to the region of its maximum field strength field, and means is provided at the region of maximum magnetic field strength of the objective lens to decelerate the electrons to speeds of the same order as those at which they were emitted from the body.

The first electron lens system may be arranged to focus the electron beam to a point before the electron objective lens. This has been found to enable the beam to be focussed to a finer point (of about ¼ the diameter) on the body than if the first electron lens system and the electron objective lens together produce the first focus of the beam.

The electron collecting means may include electrostatic deflecting means and be located between the first electron lens and the electron objective lens for deflecting the secondary electrons passing through the filter grid away from the axial direction. Advantageously, this electrostatic deflecting means may take the form of two electrostatic quadrupoles as disclosed in a paper entitled "Electron detectors for electron beam testing of ultra large scale integrated circuits" by S. C. J. Garth and D. F. Spicer in scanning Electron Microscopy 1986/II pages 465–472. In such an arrangement the two quadrupoles may serve to deflect the secondary electrons passing the filter grid to an electron detector to one side of the apparatus, for example, a scintillator with a light pipe conveying the resulting light flashes to a photomultiplier.

The electron objective lens may take the form of a magnetic lens having an annular core of magnetic material of U-shaped cross-section with the open side facing inwardly and containing a coaxially wound energising winding, and a plurality of coaxial annuli of magnetic material partially closing the open side of the core to leave a main gap near one end of the lens defining the region of maximum magnetic field strength and a plurality of narrower gaps between the annuli and between an annulus and the core so that the magnetic field strength decays substantially evenly from the maximum towards the other end of the lens.

The sharp increase in the magnetic field strength of the objective lens at the end nearer the body should occupy a short axial length and the secondary electrons accelerated to pass through it at high speed (e.g. 500–1000 eV) so that the flattening (i.e. the reduction in the pitch) of the helical paths of the secondary electrons is kept as small as reasonably possible. At the region of maximum magnetic field the secondary electrons are decelerated to speeds close to the emission speeds from the body (e.g. 20 eV), so that the sustained gradual decrease in the magnetic field strength over the remainder of the length of the objective lens is effective over several cycles of the helical paths of the secondary electrons, so that a substantial increase in the pitch of the paths is obtained and the trajectories of the secondary electrons are brought to be more nearly parallel to the axis when they reach the filter grid.

Advantageously the secondary electrons are constrained to enter the magnetic field of the objective lens through a relatively small area on the axis of the apparatus.

The means for extracting secondary electrons emitted by the body and directing them back into the objective lens may comprise an extractor grid maintained at a potential of, say, 500 to 1,000 volts relative to the body and located between the end of the objective lens nearer the body and the body itself. The attractive force of the extractor grid will accelerate the secondary electrons to a high speed and they may be maintained at that speed by a second grid at substantially the same potential as the extractor grid whilst they enter the magnetic field of the objective lens. A retarder grid at, say, 20 volts may be provided to slow the secondary electrons down again at the region of maximum magnetic field. It is desirable to slow the secondary electrons still further so that they approach the filter grid at substantially the same speed as they left the surface of the body (e.g. 5 eV). This further slowing down may be achieved by a retarding electrostatic field set up in a tube inside the objective lens using an electrically resistive coating on the tube to which suitable potential supplies are connected. The filter grid may be mounted at the end of the tube remote from the body.

A particular use of electron beam apparatus according to the present invention is the testing of integrated circuits in operation. An integrated circuit to be tested forms the body on which the electron beam is focussed, the circuit being connected to other components and electrical supplies so that it should operate as required. The electron beam is focussed on each part of the circuit to be investigated in turn, when the secondary electrons have energies reflecting the potential at the part of the circuit at the time. The potential of the filter grid may be controlled in response to the number of secondary electrons passing it so as to follow the potential of the integrated circuit part, for example using the apparatus described in copending U.S. application Ser. No. 872,567 filed June 10, 1986 by Denis F. Spicer, assigned to Texas Instruments Incorporated and incorporated hereby by reference.

According to a second aspect of the present invention there is provided electron beam apparatus in which an electron beam is directed on to a body in an approximately axial direction through a magnetic lens producing a substantially axial magnetic field and secondary electrons emitted from the body due to the electron beam bombardment are attracted electostatically into the magnetic lens and passing through it in a direction opposite to that of the electron beam encounter a filter grid electrostatically biassed to allow only those electrons having energies above a predetermined level to pass to an electron detector, wherein the field of the magnetic lens has its maximum value close to the end of the lens nearer the body, the secondary electrons being accelerated to pass at high speed through the magnetic field as it increases over a short distance to the maximum value, the secondary electrons then being retarded to a low speed at the region of maximum field strength and passing slowly through the part of the field where it decays progressively over a much longer distance.

According to a further aspect of the present invention there is provided a magnetic lens for use in electron beam apparatus having an annular core of magnetic material of U-shaped cross-section with the open side facing inwardly and containing a coaxially wound energising winding, and a plurality of coaxial annuli of magnetic material partially closing the open side of the core to leave a main gap near one end of the lens defining the region of maximum magnetic field strength and a plurality of narrower gaps between the annuli and between an annulus and the core so that the magnetic field strength decays substantially evenly from the maximum towards the other end of the lens.

According to yet another aspect of the present invention there is provided a method of measuring the energies of electrons when they are emitted from a body comprising the steps of accelerating the electrons in an axial direction away from the body by means of a substantially planar electrostatic field, maintaining the electrons at high speed as they enter an axial magnetic field, passing through a region of high gradient to a region of maximum field strength, retarding the electrons to a lower speed of the same order as that at which they were emitted from the body while they are in the region of maximum field strength, passing the electrons at a speed close to the lower speed through a region of the magnetic field which weakens at a low gradient, applying the electrons at a speed substantially equal to that at which they were emitted from the body to a biassed planar filter grid, transverse to the axis, detecting electrons passing the filter grid, and controlling the bias on the filter grid in response to the detected electrons so as to limit the number of detected electrons, whereby the bias on the filter grid substantially represents the energies of the electrons emitted from the body.

In order that the invention may be fully understood and readily carried into effect an embodiment of it will now be described with reference to the accompanying drawings, of which:

FIG. 5 shows computed path of a secondary electron leaving the surface of the sample and being reflected by the filter grid back to the sample.

Figure 1:
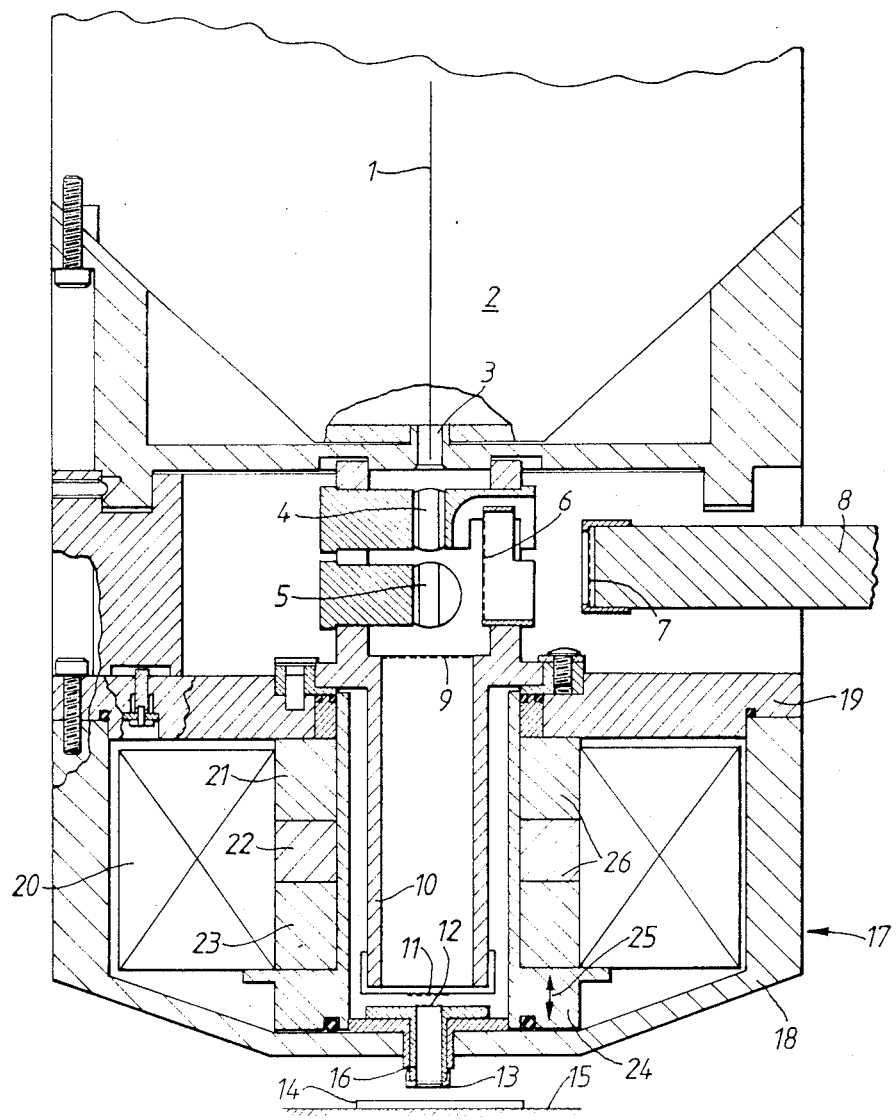
FIG. 1 shows partly in cross-section an electron beam apparatus according to the invention.

In FIG. 1, there is shown part of the electron beam apparatus, the cathode, upper parts of the beam forming components and the beam deflection components not being shown since these would be of conventional form for a scanning electron microscope. The apparatus has a central axis 1 extending through it and has at its upper end an electron beam lens 2 which produces through a beam aperture 3 a focussed electron beam. Below the aperture 3 are located upper and lower guadrupoles 4 and 5 which serve the purpose of accelerating and diverting secondary electrons through an electron collector 6 to a scintillator 7 mounted on the end of a light pipe 8. The quadrupoles 4 and 5 are also arranged to reduce astigmatism of the beam resulting from the secondary electron diversion field. The electron collector 6 consists of a metal ring with an electrically conductive mesh over its inner end through which the electrons are accelerated towards the scintillator 7. The light pipe 8 serves to convey the light flashes from the scintillator 7 to a photomultiplier, not shown in FIG. 1, which produces the output electrical signal of the apparatus. Below the lower quadrupole 5 is a filter grid 9 mounted at the top of a retarding field tube 10. At the lower end of the tube 10 is mounted a retarder grid 11, a second grid 12 being mounted on the top of an electron tube 16 having at its lower end an extractor grid 13.

A sample 14, which typically would be an integrated circuit, is mounted on a support 15 which is movable to enable the part of the sample 14 which is of interest to be brought beneath the electron tube 16.

The magnetic objective lens 17 is provided around the retarding field tube 10 and consists of a core of magnetic material comprising a cup 18 and an annular disc 19 fitted on top of the cup. Within the core there is provided a winding 20 which when energised produces an axial magnetic field. Three annuli 21, 22 and 23 on a non-magnetic liner 24 close the inner aperture of the magnetic core leaving a main non-magnetic gap 25 and three narrower gaps 26.

In the operation of the apparatus, the electron beam passing through the aperture 3 is focussed to a point in the vicinity of the quadrupoles 4 and 5 and is refocussed by the magnetic objective lens 17 to a fine spot on the surface of the sample 14 at a position dependent on the deflection of the beam The high energy (1-5 keV.) of the electrons of the beam has the result that these electrons are substantially unaffected by passage through the grids used to control the secondary electrons. On striking the sample 14 the electron beam causes the emission of secondary electrons the energy of which is largely independent of the beam energy, but strongly dependent on the potential of the part of the sample 14 on which the beam falls. The secondary electrons are strongly attracted by the extractor grid 13 which is maintained at a potential in the range 500 to 1,000 volts positive with respect to the sample 14, so that the secondary electrons are accelerated into the electron tube 16. In the tube 16, which is of non-magnetic material, the electrons are maintained at high speed by the second grid 12, which is at substantially the same potential as the extractor grid 13, as they pass through the hole in the cup 18 to enter the magnetic field of the objective lens 17. The retarder grid 11, held at about 20 volts positive causes the secondary electrons to slow down abruptly as they reach the region of maximum magnetic field, and this slowing down is continued by the retarding field tube 10 which has an electrically resistive coating on its inside which is maintained at a graduated potential so as to retard the secondary electrons to their emission speeds from the sample 14. At the filter grid 9, the secondary electrons encounter a potential which is adjusted to such a negative value as to permit only a proportion of the secondary electrons to pass through it, a circuit arrangement for controlling the potential on the filter grid being described in, for example, the above mentioned U.S. Pat. No. 4,801,879. The secondary electrons passing the filter grid 9 are deflected to the right as shown in FIG. 1 by the lower quadrupole 5 through the electron collector 6 towards the scintillator 7. The electron collector 6 is kept at 50-100 volts positive and the scintillator 7 at about 10 kV positive so as to attract the secondary electrons which on striking the scintillator cause it to emit flashes of light which are conveyed along the light path 8 to a photomultiplier, not shown. The output signal of the photomultiplier is fed back to control the potential of the filter grid 9 in the manner described, for example, in the above mentioned U.S. Pat. No. 4,801,879. Other methods of setting the potential of the filter grid 9, so that only a relatively small number of electrons reach the scintillator 7, could be employed.

Figure 2:
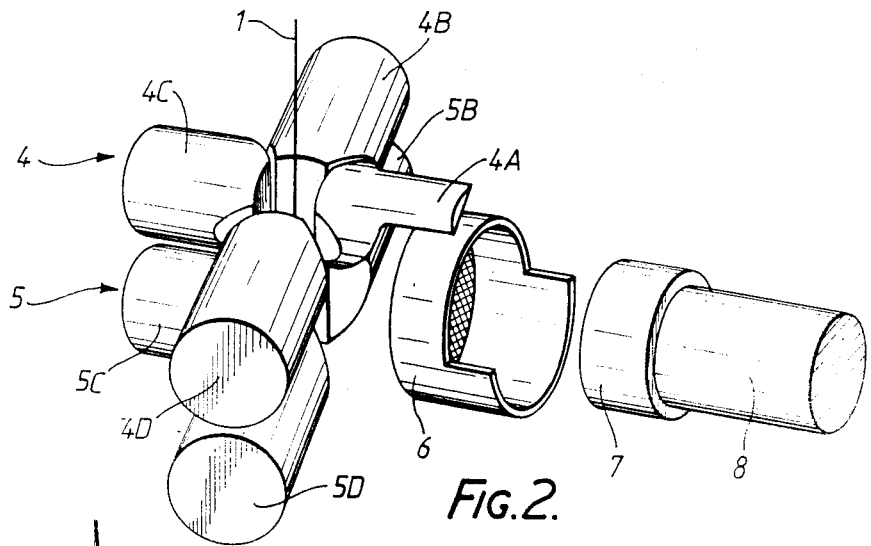
FIG. 2 is a perspective diagram of the quadrupoles 4 and 5 of the apparatus shown in FIG. 1.

FIG. 2 is a perspective diagram showing in detail the construction of the upper and lower quadrupoles 4 and 5, the electron collector 6, the scintillator 7 and the light pipe 8. It will be appreciated that these components are held firmly in position by means not shown, the electrodes of the quadrupoles being mounted in electrically insulating material. The upper quadrupole 4 consists of four electrodes 4A, 4B, 4C and 4D at right angles to one another in the same plane, and the lower quadrupole 5 consists of three electrodes 5B, 5C and 5D at right angles to each other in a plane below the quadrupole 4 together with the electron collector 6 which acts as the fourth electrode.

In operation, the upper quadrupole 4 is maintained at potentials more negative than those of the lower quadrupole 5, so that the electrons accelerated upwards by the attraction of the lower quadrupole are reflected down again by the upper quadrupole so as to improve the efficiency of the electron collection. Typical values of the potentials are −30 volts and −20 volts for the electrodes 4A and 4C and +40 volts for the electrode 5C. The electron collector 6 would be maintained at a potential of about +100 volts and the scintillator 7 at about +10 kV. The function of the lower quadrupole 5, including the electron collector 6, is to accelerate the secondary electrons, which pass through the filter grid 9, and are therefore moving only slowly, and to divert them towards the electron collector 6. The secondary electrons collected pass through the mesh of the collector 6 and are accelerated rapidly on to the scintillator 7.

The upper quadrupole 4 has several functions. It compensates for the deflection of the beam produced by the lower quadrupole and to some extent also for the distortion of the spot resulting from the cylindrical lens effect of the secondary electron diversion field and for the astigmatism resulting from the spread of the electron speeds in the beam.

The voltages on the electrodes 4B, 4D, 5B and 5D are also selected to reduce further the distortion of the spot as mentioned above.

The detailed description of the operation of these two quadrupoles is to be found in the paper "Electron detectors for electron beam testing of ultra large scale integrated circuits" by S C J Garth and D F Spicer in "Scanning Electron Microscopy", 1986/II, pages 465 to 472.

Figure 3:
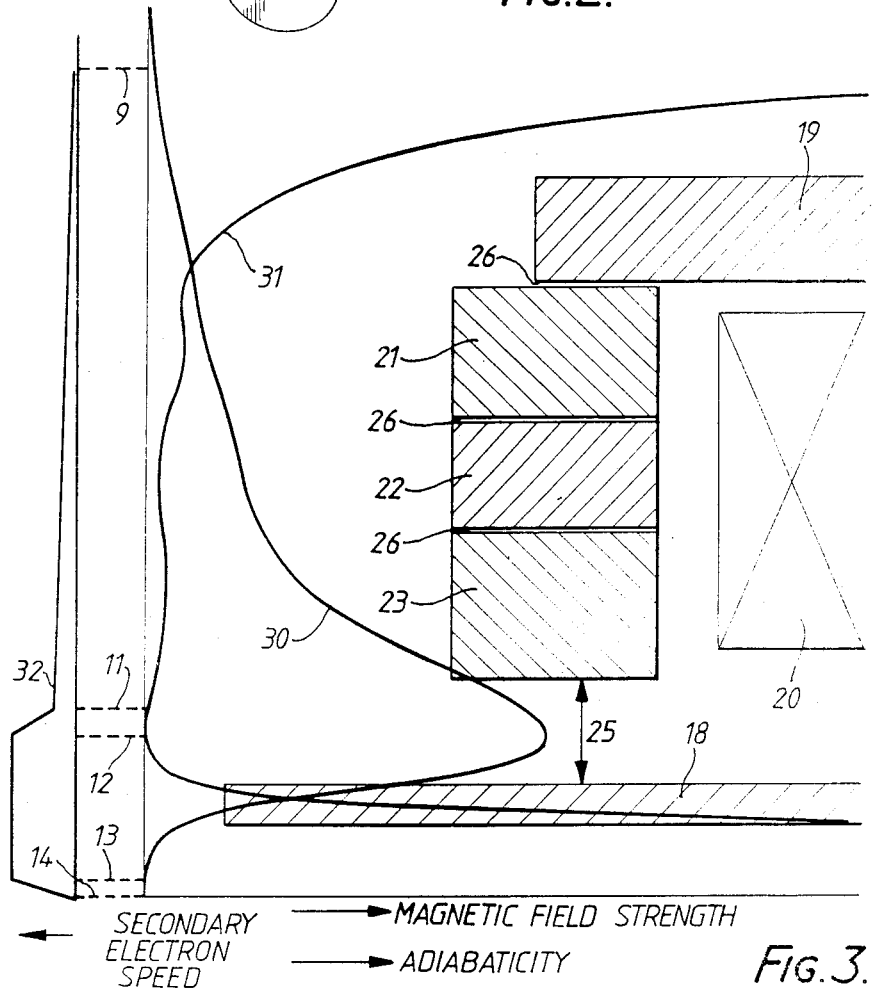
FIG. 3 is a diagram of the magnetic objective lens of the apparatus of FIG. 1 showing the magnetic field strength and adiabaticity of the magnetic field.

FIG. 3 is a diagram of part of the magnetic objective lens 17 in which the parts carry the same reference numerals as in FIG. 1. In this diagram the main gap 25 and the smaller gaps 26 are clearly shown. Superimposed on the diagram of the physical components of the lens is a curve 30 which represents the magnetic field strength in the axial direction which is effective along the axis of the lens and a curve 31 which represents the adiabaticity of the field. Also shown is a curve 32 which represents the speed of a typical secondary electron as it moves upwards through the field. It will be seen that the magnetic field increases from a zero value just outside the hole in the cup 18 up to a maximum at the main gap 25. This increase occurs over a very short axial distance and it will be appreciated that as the secondary electrons pass through this region of sharply increasing field they are travelling at a very high speed to which they have been accelerated by the extractor grid 13.

The strength of the magnetic field falls more gradually in the upward direction because of the control of the magnetic field exercised by the gaps 26 between the annuli 21, 22 and 23 and which separate the annulus 21 from the disc 19. The gaps 26 act as impedances in the magnetic circuit and can be adjusted to provide precisely the decay curve required for the magnetic field. As shown by curve 32, at the region of maximum field strength the secondary electrons are slowed abruptly and are further slowed progressively to substantially their emission speeds from the sample 14 as they pass through the upper part of the lens field to the filter grid 9.

The second curve 31 shown in FIG. 3 this represents the adiabaticity. If the variation of the magnetic field in the axial direction is adiabatic, the field experienced by an electron changes negligibly in the course of one revolution of its helical motion, and if this is true then the angular momentum of the electron is a conserved quantity. Because of the high speed of the secondary electrons entering the magnetic field from below as shown by curve 32, the adiabaticity of the sharply increasing field is large indicating that the electrons do not execute progressively flattened helices of smaller and smaller pitch as they enter the field but arrive at the region of maximum field strength with relatively little change to their directions of motion. From the maximum field region upwards the changes in the magnetic field are substantially adiabatic so that the helical paths of the electrons develop a progressively longer pitch as they move upwards through the weakening field. The result is that electrons arrive at the filter grid 9 with a motion which is at only a small angle to the normal to the filter grid, thereby enabling an accurate assessment of their energies to be made by the use of a plane filter grid.

Figure 4:
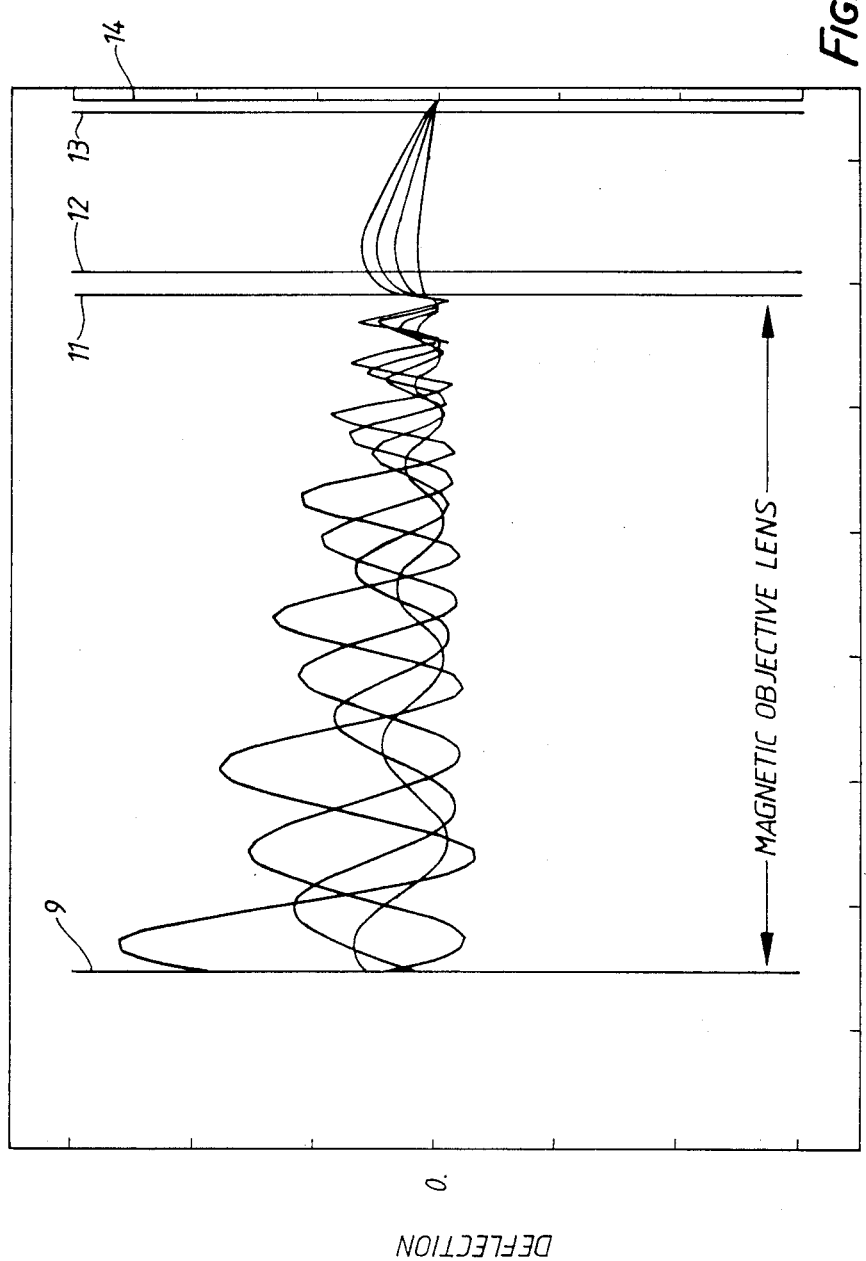
FIG. 4 shows the computed helical paths of secondary electrons leaving the surface of the sample at different angles.

FIG. 4 shows computed paths for secondary electrons leaving the surfaces of the sample 14 at angles of 11°, 23°, 34° and 46° to the normal. Marked on the figure are the positions of the grids 9, 11, 12 and 13, and the region of the magnetic field of the objective lens is also indicated. As illustrated in this figure (and FIG. 5), the scale of the transverse movement of the electrons is amplified about 100 times relative to their axial movement from which it can be appreciated that the secondary electrons always approach the filter grid 9 at an angle close to its normal.

FIG. 5 is a diagram similar to FIG. 4 showing the path of a secondary electron leaving the sample at 11° to the normal and being reflected by the filter grid 9 to return to the sample some distance away from the point of emission. This shows that the returned secondary electrons will have minimal effect on the energies of the emitted secondary electrons by charging the surface of the sample.

Although the invention has been described with reference to a specific embodiment of it, it will be appreciated that many changes could be made to the embodiment without departing from the invention. For example, other electrode configurations such as concentric rings could be used in place of grids or meshes for accelerating and retarding the electrons. The secondary electrons could be deflected from the axis towards electron responsive means by other electrostatic and/or magnetic field arrangements. The electron responsive means which as described is a scintillator may take other forms such as an electrode or an electron multiplier, and more than one such means may be provided for electrons of different energies, the deflection arrangement being such as to produce different trajectories for electrons of different energies. The construction of the objective lens may be modified provided that it produces the magnetic field pattern described, using for example different magnetic materials and/or shaping to give the required field.

The invention may be used for purposes other than the monitoring of the performance of integrated circuits.

We claim:

1. Electron beam apparatus including an electron gun for producing an axially directed, focused electron beam; a magnetic electron objective lens for focusing the electron bean to a spot on a body when located on a support beyond the objective lens; electrostatic means located beyond the magnetic objective lens and close to the support for accelerating secondary electrons emitted by the body and directing them back into and through the magnetic field within the magnetic electron objective lens, a filter electrode placed so as to be approached by secondary electrons after passage through the objective lens and means for biasing the filter electrode to such a potential as to allow to pass only those secondary electrons having energies greater than a predetermined value, electron collecting means for receiving the secondary electrons passing through the filter electrode, the objective lens producing an axial magnetic field which has a region of maximum field strength close to the end of the lens nearer the support, with a high gradient rising from the end of the lens nearer the support to the region of maximum field strength, and an adiabatically falling, lower gradient between the region of maximum field strength and the end of the lens further from the support, the electrostatic accelerating means arranged to accelerate the secondary electrons to a high speed at which they pass through the high gradient part of the objective lens field to the region of its maximum field strength, and means provided at the region of maximum magnetic field strength of the objective lens to decelerate the electrons to approach the filter electrode at speeds of the same order as those at which they were emitted from the body.

2. Apparatus according to claim 1 wherein the first electron lens system is arranged to focus the electron bean to a point before the beam enters the electron objective lens.

3. Apparatus according to claim 2, wherein the filter electrode is located at the end of the electron objective lens nearer the first electron lens system, and the electron collecting means includes electrostatic deflecting means located between the first electron lens system and the electron objective lens for deflecting secondary electrons passing through the filter electrode away from the axial direction.

4. Apparatus according to claim 3 wherein the electrostatic deflecting means comprises two electrostatic quadrupoles spaced along the axis of the apparatus, the electrodes of the first quadrupole, nearer the electron objective lens, being biassed to deflect the secondary electrons through one of the electrodes which is in the form of a tube and the electrodes of the second quadrupole nearer the first electron lens system being biassed to repel electrons to the first quadrupole and to compensate for the deflection of the beam produced by the first quadrupole and also to some extent for the cylindrical lens effect of the first quadrupole and its astigmatism.

5. Apparatus according to claim 1, wherein the electron objective lens is a magnetic lens having an annular core of magnetic material of U-shaped cross-section with the open side of the U facing inwards and having a co-axially wound energising winding, and a plurality of coaxial annuli of magnetic material partially closing the open side of the core to leave a main gap near one end of the lens defining the region of maximum magnetic field strength and a plurality of narrower gaps so that the magnetic field strength decays adiabatically from its maximum at the main gap towards the other end of the lens.

6. Apparatus according to claim 1, wherein the means to decelerate the secondary electrons at the region of maximum field strength comprises a retarder electrode and means for biasing the retarder electrode at a selected potential.

7. Apparatus according to claim 6 further including an electrically resistive tube within the electron objective lens arranged to set up a retarding electrostatic field effective on the secondary electrons after they have passed the retarder electrode to slow the secondary electrons so that they approach the filter electrode at substantially their emission speeds from the body.

8. Apparatus according to claim 1, including means for constraining the secondary electrons to enter the magnetic field of the electron objective lens over an area closely surrounding the axis of the apparatus.

9. Apparatus according to claim 8 wherein the extracting means comprises an electrostatic extractor electrode placed close to the body and maintained at a positive potential of 500 to 1,000 volts relative to the body, and a second electrode maintained at substantially the same potential as the extractor electrode and spaced from it in the direction of the electron objective lens, the extractor electrode and the second electrode being mounted on a tube of non-magnetic material which extends along the axis of the apparatus.

10. Apparatus according to claim 1, wherein said filter electrode is a planar electrode disposed transversely of said axial direction.

11. A method of detecting secondary electrons emitted from a body by directing a primary electron beam in an axial produced by an objective lens direction through an axial magnetic field to impinge on the body at a location outside the magnetic field comprising the steps of accelerating the secondary electrons in an axial direction away from the body by means of a substantially planar electrostatic field, maintaining the electrons at high speed as they enter the axial magnetic field, passing through a magnetic field region of high gradient to a region of maximum field strength, retarding the secondary electrons while they are in the region of maximum field strength to a lower speed of the same order as that at which they were emitted from the body, passing the secondary electrons at a speed close to the lower speed through a region of the magnetic field in which it weakens adiabatically at a lower gradient, applying the secondary electrons at a speed substantially equal to that at which they were emitted from the body to a biased planar filter electrode placed transverse to the axis, beyond the objective lens detecting secondary electrons passing the filter electrode, and controlling the bias on the filter electrode in response to the detected secondary electrons so as to limit the number of detected secondary electrons such that the bias on the filter electrode substantially represents the energies of the secondary electrons emitted from the body.

12. A method of detecting secondary electrons emitted from a body by directing a primary electron bean in an approximately axial direction through an axial magnetic field to impinge on the body at a location outside the magnetic field; in a direction extending away from the body, the magnetic field increasing over a short distance with a high gradient to a maximum value and then falling adiabatically with a low gradient over a longer distance; electrostatically accelerating secondary electrons emitted from the body to a high speed to pass initially into the high gradient portion of the magnetic field, then decelerating the secondary electrons at the region of maximum magnetic field strength to speeds of the same order as those at which they were emitted from the body, to pass through the low gradient, falling magnetic field causing the secondary electron paths assume substantially axial directions, and then passing those of the axially directed secondary electrons having selected energies through an energy selection filter for collection.

13. A method according to claim 12, wherein the filter is a planar filter arranged transversely of said axial direction.

14. A method according to claim 12, for testing integrated circuits in an operative state in which the body on which the electron beam is focused is an integrated circuit under test, the electron bean is directed to a selected part of the circuit, and an electrical signal is produced in response to the rate at which secondary electrons pass the filter electrode, and said electrical signal is used to control the potential of the filter electrode so the changes in that potential follow substantially the changes in potential at the selected part of the integrated circuit.

* * * * *